United States Patent
Nguyen et al.

(10) Patent No.: US 6,554,004 B1
(45) Date of Patent: Apr. 29, 2003

(54) METHOD FOR REMOVING ETCH RESIDUE RESULTING FROM A PROCESS FOR FORMING A VIA

(75) Inventors: Thien T. Nguyen, Austin, TX (US); Valentin Medina, Jr., Austin, TX (US); Douglas J. Dopp, Austin, TX (US)

(73) Assignee: Motorola, Inc., Schaumburg, IL (US)

(*) Notice: Subject to any disclaimer, the term of this patent is extended or adjusted under 35 U.S.C. 154(b) by 79 days.

(21) Appl. No.: 09/707,595

(22) Filed: Nov. 7, 2000

(51) Int. Cl.[7] .................................................. C25F 5/00
(52) U.S. Cl. .............................. 134/1.3; 134/2; 134/26; 134/30; 134/902; 216/64; 216/67; 438/906
(58) Field of Search ............................ 134/1.3, 2, 26, 134/902, 30; 216/64, 67; 438/906

(56) References Cited

U.S. PATENT DOCUMENTS

| | | | |
|---|---|---|---|
| 5,378,311 A | | 1/1995 | Nagayama |
| 5,681,780 A | | 10/1997 | Mihara |
| 5,780,359 A | * | 7/1998 | Brown et al. ................ 134/1.2 |
| 5,817,579 A | | 10/1998 | Ko |
| 5,908,735 A | * | 6/1999 | Kim et al. ................... 430/313 |
| 6,117,786 A | | 9/2000 | Khajehnouri |
| 6,130,166 A | * | 10/2000 | Yeh ............................. 438/710 |
| 6,207,583 B1 | * | 3/2001 | Dunne et al. ................ 134/1.2 |
| 6,352,861 B1 | * | 12/2001 | Stinnett ....................... 141/130 |
| 6,376,384 B1 | * | 4/2002 | Yen ............................. 438/637 |

FOREIGN PATENT DOCUMENTS

| | | |
|---|---|---|
| WO | WO99/60620 | 11/1999 |
| WO | WO 00/12231 | 3/2000 |

* cited by examiner

*Primary Examiner*—Randy Gulakowski
*Assistant Examiner*—M. Kornakov
(74) *Attorney, Agent, or Firm*—James L. Clingan, Jr.; Kim-Marie Vo

(57) ABSTRACT

Etch residue, resulting from a process used in forming a via, is removed using a process that does not require using a liquid chemical solvent and does not result in excessive charge build-up in the via. One step is to use a fluorocarbon and oxygen. These gases are energized by both microwave and RF. Another step is to introduce argon, in addition to the other two gases, also energized by microwave and RF. This has the effect of removing any additional residue which tends to stick on the surface above the via as well completing the removal of etch residue in the via. An additional step is simply to apply de-ionized water to remove any remaining fluorinated residue that, as a result of the preceding two steps, is highly soluable in water.

9 Claims, 2 Drawing Sheets

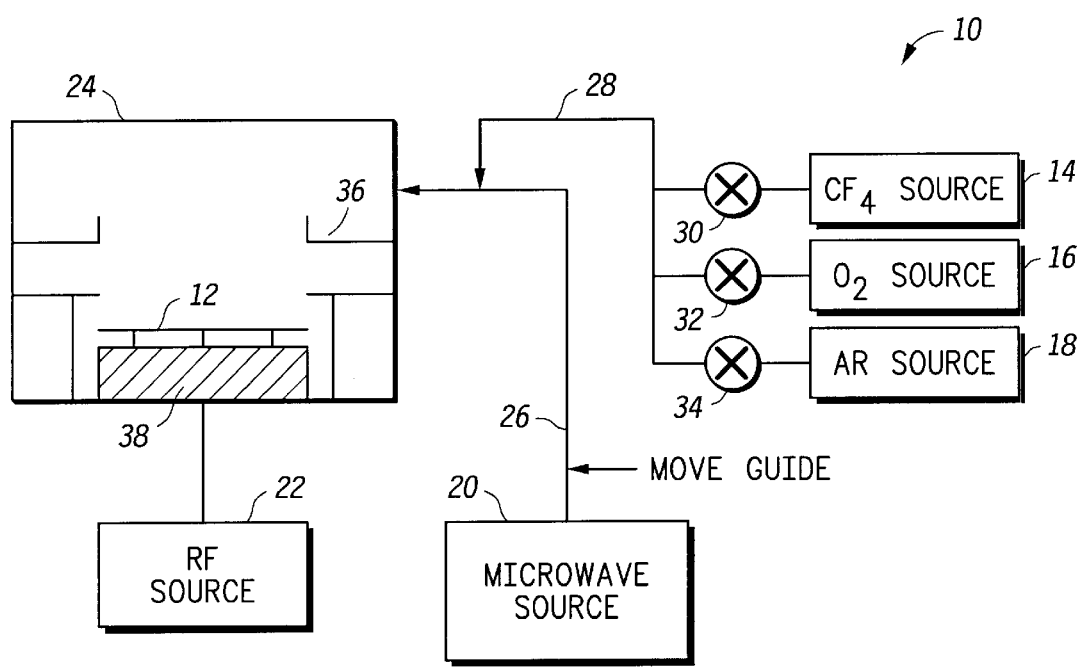
*FIG.1*
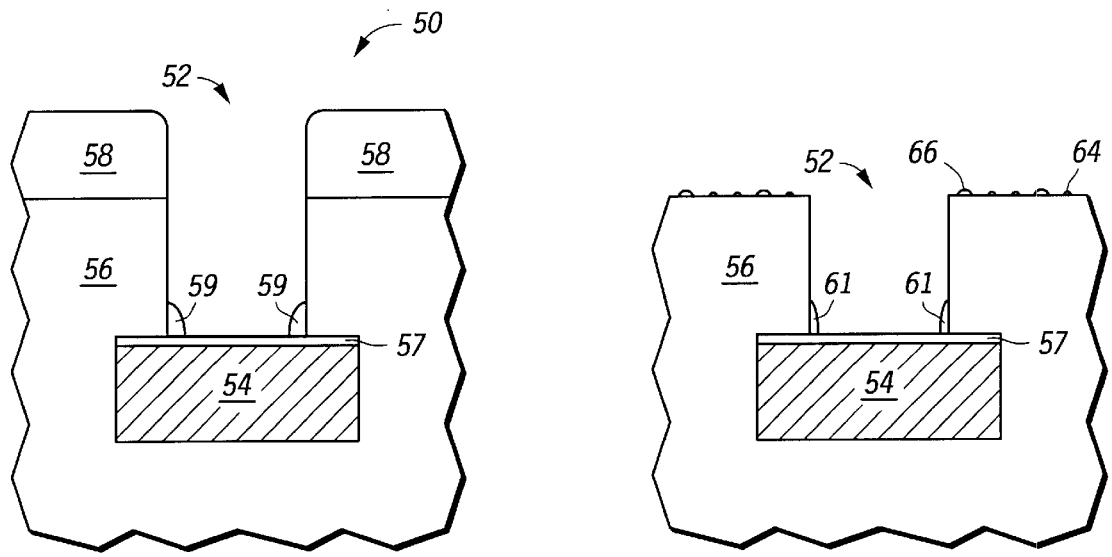
*FIG.2*
−PRIOR ART−
*FIG.3*

METHOD FOR REMOVING ETCH RESIDUE RESULTING FROM A PROCESS FOR FORMING A VIA

FIELD OF THE INVENTION

This invention relates to methods for manufacturing integrated circuits, and more particularly, methods for removing photoresist.

RELATED ART

In integrated circuit manufacturing one of the requirements is to form vias between interconnect layers, which are typically metal. These interconnect layers are separated by an interlevel dielectric, also known as interlayer dielectric, or simply ILD. In forming the connection between the two interconnect layers, a via is formed in the interlayer dielectric prior to the formation of the upper interconnect layer. In the formation of the via, photoresist is used to provide a pattern for the vias. After the photoresist has been patterned, the via is etched through the interlevel dielectric to the underlying interconnect layer. An important aspect of this process is the subsequent removal of the photoresist. The photoresist must be removed before a subsequent formation of the upper interconnect layer on the interlevel dielectric and in the via. One of the problems in removing photoresist is that etch residue, commonly in a form called veils, or via veils, are typically formed on the sidewall at the bottom of the via and at the upper corners of the via. (The veils can also extend on the entire sidewall of the via.) These veils are a byproduct of the etchant materials that are used during the formation of the via and silicon and carbon from the etched interlevel dielectric and metal that is sputtered from the underlying metal interconnect layer at the bottom of the via.

These veils are typically removed by a wet clean using a liquid solvent. The photoresist is first removed using a dry strip followed by this solvent clean. The dry strip typically uses a microwave energy source for energizing the reactant species, a plasma which attacks the photoresist, which is a polymer, to strip the photoresist. The subsequent use of the solvent as the wet clean effectively removes the veils and any resist residue. After the solvent has been introduced, water is used to rinse off the solvent. The solvent is very effective but has a high consumable cost and potential problems with shrinking geometries. One potential problem is that there may be difficulties getting the solvent into the very small vias. Additionally, if the solvent is not removed completely by the water, it leaves a residue which can result in a high resistance via or unreliable electrical contact. Empirical data shows that this type of solvent-cleaned via must be filled with a metal in a timely manner, typically within twenty-four hours, to avoid excessive resistance in the contact.

One of the techniques that has been attempted to overcome the use of solvents is to use RF as an energizing source for the plasma. This has been shown to be effective in removing the veil, however, it also results in excessive charge build-up on the interconnect. The interconnect, at least in some places, will be connected to gate dielectrics. The consequent accumulation of charge on the interconnect will establish a voltage differential across the gate dielectric which may be excessive, resulting in the gate dielectric being damaged. The excessive charge build-up in the via which results in gate dielectrics being damaged is, of course, a big problem. Attempts to use RF energized $NF_3$, $O_2$, and $N_2H_2$ have resulted in problems with excessive charge build-up, inadequate uniformity across the wafer, and a requirement to fill the via within twenty-four hours after via formation.

Thus, there is a need for the ability to remove photoresist that does not use a liquid solvent and does not result in one or more of the problems associated with known chemical RF cleans.

BRIEF DESCRIPTION OF THE DRAWINGS

The present invention is illustrated by way of example and not limitation in the accompanying figures, in which like references indicate similar elements, and in which:

FIG. 1 shows an apparatus for use in making the invention;

FIG. 2 shows an cross section of a portion of an integrated circuit according to the prior art;

FIG. 3 shows a cross section the portion of the integrated circuit of FIG. 2 after subsequent processing according to the invention;

DETAILED DESCRIPTION

Figure 4:
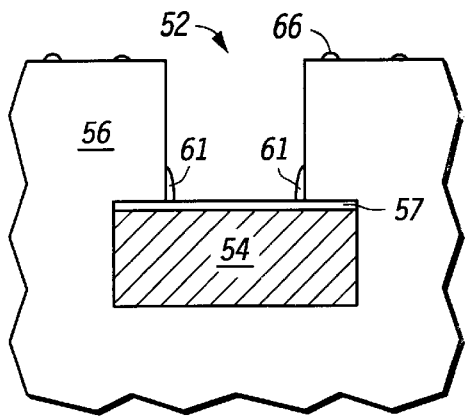
FIG. 4 shows a cross section the portion of the integrated circuit of FIG. 3 after subsequent processing according to the invention.

The following description describes an embodiment using $CF_4$ and $O_2$ as primary chemicals for removing photoresist. The subsequent addition of argon aids in cleaning the photoresist deposited above the ILD. After that, de-ionized water removes fluorinated compounds that are soluble as a beneficial result of the first two steps. The chemicals are energized by both RF and microwave at a temperature above room temperature, which is typically thought of as about 25 degrees Celsius (C.).

Shown in FIG. 1 is an apparatus 10 having a semiconductor wafer 12 present therein. Apparatus 10 comprises a $CF_4$ source 14, an $O_2$ source 16, an argon source 18, a microwave source 20, an RF source 22, a reaction chamber 24, a wave guide 26, an inlet tube 28, a valve 30, a valve 32, a valve 34, baffles 36, and a chuck 38. Reaction chamber 24 has in it baffles 36, wafer 12, and chuck 38. RF source 22 is connected to chuck 38. Microwave source 20 is connected to reaction chamber 24 by wave guide 26. $CF_4$ source 14 is selectively coupled to inlet 28 via valve 30. $O_2$ source 16 is selectively coupled to inlet 28 via valve 32. Argon source 18 is selectively coupled to inlet 28 via valve 34. Inlet 28 is coupled to wave guide 26 so that gases in inlet tube 28 enter into wave guide 26 and are energized by microwave source 20. The gases then enter chamber 24 from inlet 28 via wave guide 26 in an energized condition.

Shown in FIG. 2 is a portion 50 of wafer 12 after forming a via according to techniques known in the art. Portion 50 shows a via 52 with an underlying metal layer 54, an interlayer dielectric 56, and photoresist layer 58. Portion 50 as shown in FIG. 2 is at a stage after the photoresist has been etched to form a mask and the interlayer dielectric has been etched, using this mask, down to the metal layer to form via 52. In a preferred embodiment, metal layer 54 includes an anti-reflective coating 57. Immediately after the removal of the interlayer dielectric in the via 52, there remains in the corners immediately above the metal 54, accumulations 59 of materials resulting from the etch. These materials include carbon, silicon, nitrogen, fluorine, and titanium. These are the materials that are likely to form a veil and create a subsequent problem when the via is filled to form an electric contact. This is the typical starting point for at the time the veils need to be removed.

The next step is to use the apparatus of FIG. 1 to remove the photoresist, according to an embodiment of the invention. After placing wafer 12 on chuck 38, photoresist 58 is removed by having microwave source 20 and RF source 22 active and introducing a $CF_4$ gas and an oxygen gas into chamber 24 via wave guide 26. Thus, $CF_4$ and $O_2$ enter chamber 24 energized by microwave source 20 and further energized by RF source 22. This causes an efficient removal of photoresist 58 and a breakdown of polymer bonds present in the sidewall at the bottom of the via where veils can form. In a preferred embodiment, the RF and microwave powers are simultaneously applied. In another embodiment, the $CF_4$ and $O_2$ are energized only by the RF power or the microwave power. Typically, there remains a photoresist residue 64 as well.

Figure 5:
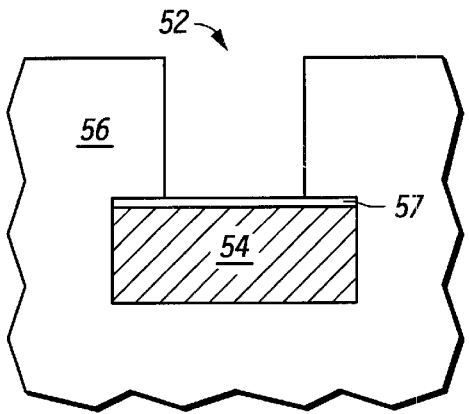
FIG. 5 shows a cross section the portion of the integrated circuit of FIG. 4 after subsequent processing according to the invention.

After photoresist 58 has been substantially removed, as shown in FIG. 3, a subsequent removal step using apparatus 10 is applied. After the $CF_4/O_2$ strip of the photoresist, there still remains some residue 66 shown in FIG. 3 on the ILD including some fluorine. There is also fluorine accumulation 61 in the bottom of the via at the corners of the via 52. The next step is to further include argon in inlet 28 and thus into wave guide 26. Thus, the second step is using $CF_4$, $O_2$, and argon introduced as having been microwave energized into chamber 24 which is subjected to RF source 22 being active. In a preferred embodiment, the RF and microwave powers are simultaneously applied. In another embodiment, the $CF_4$ and $O_2$ are energized only by the RF power or the microwave power. The result of this step, which uses microwave and RF-energized $CF_4$, $O_2$, and argon, is shown in FIG. 4. This shows the removal of photoresist residue 64 leaving behind a fluorinated residue 61 and 66. The fluorinated residue 61 and 66 is then removed using de-ionized water. The de-ionized water is effective in removing the fluorinated residue 61 and 66 because the fluorine in fluorinated residue 61 and 64 easily bonds with the hydrogen in the water. Thus, the application of the water is effective in dissolving and removing fluorinated residue 61 and 66. Thus the resulting structure shown in FIG. 5 is extremely clean. The result as shown in FIG. 5 is that the subsequent deposition of the conductive material into via 52 can occur 72 hours later and still provide an excellent contact. Previously, 24 hours was the typical limit.

Thus, there is shown here the ability to remove the photoresist very effectively without using a liquid solvent. In this particular embodiment the metal is aluminum and the anti-reflective coating is titanium nitride. Other metals may be used however. Further, other gases than $CF_4$ may be used effectively as well. Other such gases include $C_2F_6$ and $C_3F_8$. $CF_4$ is believed to be more effective because of the higher ratio of fluorine to carbon. Other gases which contain carbon and fluorine may work also. In this process the RF source energy is kept below 400 watts. A power of 350 watts has been shown to work, but the preferred power for the current process is 250 watts. The higher energy results in removal of TiN if that is what is used as the anti-reflective coating. Thus for this combination of $CF_4$ and $O_2$, the energy should not be raised to the point where the removal of the anti-reflective coating becomes a problem.

The preferred range of the chuck temperature 38 is between 45°–100° C., but other temperatures elevated above room temperature may also be effective. By raising the temperature above room temperature, the removal of the veil in the corner is more effective. This is believed to be, to a large extent, because of the presence of titanium residue which is difficult to remove. Large amounts of fluorine can cause a similar problem. The elevated temperature increases the removal of the titanium portion of the veil and can be important for fluorine removal also. It helps to break down the polymer aspect of the veil which is particularly relevant to fluorine. Thus the ultimate removal of the fluorine is ensured by using the raised temperature because the fluorine is ensured of not being part of a polymer at that time. Thus it is desirable for the reaction temperature to be above room temperature. It should not be excessive either, however, because this would result in too much removal of the antireflective coating layer.

A flow rate of 1250 SCCM for $O_2$, a flow rate of 20 SCCM for $CF_4$, a pressure of 0.6 Torr, a microwave power of 1000 watts, an RF power of 250 watts, and a chuck temperature of 60 degrees Celsius may be used for the step using just $CF_4$ and $O_2$. The duration is based on conventional endpoint detection techniques. A flow rate of 1250 SCCM for $O_2$, a flow rate of 15 SCCM for the $CF_4$, a flow rate of 75 SCCM for argon, a pressure of 0.6 Torr, a microwave power of 1000 watts, an RF power of 100 watts, and a chuck temperature of 60 degrees Celsius may be used for the step of using $CF_4$, $O_2$ and Ar. The time may vary based on experimental results which may vary based on the materials used such as the particular interlevel dielectric, but 15 seconds has been shown to be effective. A preferred characteristic is that the $CF_4$ to $O_2$ ratio be less than about 0.02 to 1.

Basically, almost any pressure chosen will work. There are, however, limitations of the tool which must be considered. When using a flow rate of 1250 SCCM for $O_2$ and a flow rate of 20 SCCM for $CF_4$, the lowest pressure that can be used is around 0.35 T due to limitations of the current tool. If, however, a higher pressure is desired, the flow rate of the chemicals can be decreased. The significance of altering pressure is that a pressure less than approximately 0.45 T, generally, enhances the chemicals ability to clean the veils located at the bottom of the via. A pressure greater than approximately 0.5 T, generally, results in the chemicals cleaning photoresist on top of the ILD more than that in the via.

Figure 6:
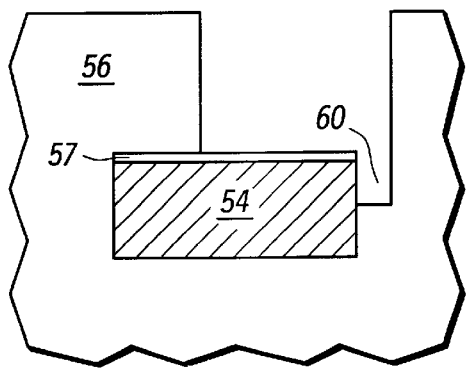
FIG. 6 shows an alternative cross section after processing according to the present invention.

This process is also very effective in the case where the via is not perfectly landed on the metal layer. In such a case the via is offset from a portion of the metal layer. Typically that results in the via being deeper where it is not in line with the metal. This results in a collection area for a solvent if that is what is used. If the solvent collects there, the veils there will also not be removed. Thus, this can be a difficult problem because of using a liquid for veil removal. Such a via is commonly called an unlanded via. In the case of an unlanded via using the present invention, there is no liquid solvent to collect in the narrow area that is adjacent to the metal. Such an unlanded via is shown in FIG. 6. The pocket area 60 is the potential problem if solvents were used. Shown in FIG. 6 is the result by using the present invention.

Skilled artisans appreciate that elements in the figures are illustrated for, simplicity and clarity and have not necessarily been drawn to scale. For example, the dimensions of some of the elements in the figures may be exaggerated relative to other elements to help improve the understanding of the embodiments of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for removing etch residue resulting from a process for forming a via in an integrated circuit, the method comprising:

providing a chamber with a chuck;

placing the integrated circuit in the chamber in contact with the chuck, wherein the integrated circuit has a dielectric layer and the via is formed within the dielectric layer;

applying RF power at a first power level to the chamber; and introducing a microwave-energized gas comprising a fluorocarbon gas and an oxygen gas into the chamber, wherein introducing the micro-wave energized gas includes removing a polymer form the surface of the via.

2. The method of claim 1, wherein the fluorocarbon is $CF_4$.

3. The method of claim 1 further comprising a de-ionized water rinse.

4. The method of claim 1, wherein the chuck is at a temperature exceeding room temperature.

5. The method of claim 4, wherein the chuck is at a temperature exceeding room temperature is further defined as 45 to 100 degrees Celsius.

6. The method of claim 1, wherein the inert gas is argon.

7. The method of claim 1, further comprising applying the RF power at a second power level while introducing the microwave-energized inert gas.

8. The method of claim 7, wherein the RF power at the second power level is less than the RF power at the first power level.

9. The method of claim 7, wherein the fluorocarbon gas to oxygen gas ratio is less when applying the RF power at a first power level than when applying the RF power at a second power level.

* * * * *